(12) United States Patent
Nakashima et al.

(10) Patent No.: US 9,947,527 B2
(45) Date of Patent: Apr. 17, 2018

(54) METHOD OF MANUFACTURING SEMICONDUCTOR DEVICE

(75) Inventors: Hiroshi Nakashima, Fukuoka (JP);
Haigui Yang, Chang chun (CN);
Hitoshi Sumida, Matsumoto (JP)

(73) Assignees: FUJI ELECTRIC CO., LTD.,
Kawasaki-shi (JP); KYUSHU UNIVERSITY, NATIONAL UNIVERSITY CORPORATION,
Fukuoka-shi (JP)

( * ) Notice: Subject to any disclaimer, the term of this patent is extended or adjusted under 35 U.S.C. 154(b) by 25 days.

(21) Appl. No.: 13/476,273

(22) Filed: May 21, 2012

(65) Prior Publication Data
US 2012/0315770 A1   Dec. 13, 2012

(30) Foreign Application Priority Data

Jun. 10, 2011   (JP) .................. 2011-129816

(51) Int. Cl.
H01L 21/02    (2006.01)
H01L 21/04    (2006.01)
(Continued)

(52) U.S. Cl.
CPC ...... *H01L 21/02052* (2013.01); *H01L 21/022* (2013.01); *H01L 21/0217* (2013.01);
(Continued)

(58) Field of Classification Search
CPC ......... H01L 21/02225; H01L 21/02247; H01L 21/02249; H01L 21/02252;
(Continued)

(56) References Cited

U.S. PATENT DOCUMENTS 6,028,012 A    2/2000  Wang
6,180,531 B1 *  1/2001  Matsumoto et al. ......... 438/706
(Continued)

FOREIGN PATENT DOCUMENTS

JP    63-172429 A    7/1988
JP    2001-345320 A   12/2001
(Continued)

OTHER PUBLICATIONS

Saks et al. "Interface trap profile near the band edges at the 4H-SiC/SiO2 interface", Applied Physics Letters, vol. 76, No. 16, pp. 2250-2252, Feb. 18, 2000.
(Continued)

*Primary Examiner* — Jae Lee
(74) *Attorney, Agent, or Firm* — Westerman, Hattori, Daniels & Adrian, LLP

(57) ABSTRACT

A method of manufacturing a semiconductor device according to the invention includes the step S1 of cleaning the silicon carbide substrate 1 surface, the step S2 of bringing a material gas into a plasma and irradiating the atoms contained in the material gas to silicon carbide substrate 1 for growing silicon nitride film 2 on silicon carbide substrate 1, the step S3 of depositing silicon oxide film 3 on silicon nitride film 2 by the ECR plasma CVD method, and the step S4 of annealing silicon carbide substrate 1 including silicon nitride film 2 and silicon oxide film 3 formed thereon in a nitrogen atmosphere. By the method of manufacturing a semiconductor device according to the invention, a semiconductor device that exhibits excellent interface properties including an interface state density and a flat band voltage is obtained.

9 Claims, 7 Drawing Sheets

(51) Int. Cl.
  *H01L 29/51* (2006.01)
  *H01L 29/66* (2006.01)
  *H01L 29/78* (2006.01)
  *H01L 29/16* (2006.01)
  *H01L 29/06* (2006.01)

(52) U.S. Cl.
  CPC .. *H01L 21/02164* (2013.01); *H01L 21/02247* (2013.01); *H01L 21/02274* (2013.01); *H01L 21/049* (2013.01); *H01L 29/513* (2013.01); *H01L 29/518* (2013.01); *H01L 29/66068* (2013.01); *H01L 29/7802* (2013.01); *H01L 29/0623* (2013.01); *H01L 29/1608* (2013.01)

(58) Field of Classification Search
  CPC ......... H01L 21/28202; H01L 29/66053; H01L 29/66477; H01L 29/78
  See application file for complete search history.

(56) References Cited

U.S. PATENT DOCUMENTS

| | | | | |
|---|---|---|---|---|
| 6,241,581 | B1* | 6/2001 | Miyashita | B24B 53/017 451/41 |
| 6,939,756 | B1* | 9/2005 | Chung | H01L 21/0214 257/E21.055 |
| 2002/0058366 | A1* | 5/2002 | Miyasaki | H01L 21/2026 438/166 |
| 2005/0017272 | A1 | 1/2005 | Yamashita et al. | |
| 2006/0214224 | A1 | 9/2006 | Ohmi et al. | |
| 2009/0170248 | A1* | 7/2009 | Kim et al. | 438/166 |
| 2010/0297839 | A1* | 11/2010 | Park | 438/591 |
| 2011/0014795 | A1* | 1/2011 | Lee et al. | 438/761 |
| 2011/0049526 | A1* | 3/2011 | Chu et al. | 257/76 |
| 2011/0126929 | A1* | 6/2011 | Velasquez-Garcia et al. | 137/561 R |
| 2011/0180812 | A1* | 7/2011 | Masuda et al. | 257/77 |
| 2012/0289040 | A1* | 11/2012 | Huang | H01L 21/82384 438/591 |

FOREIGN PATENT DOCUMENTS

| | | |
|---|---|---|
| JP | 34443589 B2 | 9/2003 |
| JP | 2004-319907 A | 11/2004 |
| JP | 2006-216918 A | 8/2006 |
| JP | 2008-147365 A | 6/2008 |
| JP | 4647211 B2 | 3/2011 |

OTHER PUBLICATIONS

Iwasaki et al. "NH3 Plasma Pretreatment of 4H-SiC(0001) Surface for Reduction of Interface States in Metal-Oxide-Semiconductor Devices", Applied Physics Express 3, 026201, pp. 026201-1-026201-3, Jan. 29, 2010.

Noborio et al. "4H-SiC MIS Capacitors and MISFETs With Deposited SiNx/SiO2 Stack-Gate Structures", IEEE Transactions on Electron Devices, vol. 55, No. 8, pp. 2054-2060, Aug. 8, 2008.

Japanese Office Action dated Oct. 21, 2014, issued in corresponding Japanese Application No. 2011-129816. w/ English Translation.(9 pages).

* cited by examiner

METHOD OF MANUFACTURING SEMICONDUCTOR DEVICE

FIELD OF THE INVENTION

The present invention relates to a method of manufacturing a semiconductor device.

BACKGROUND

Silicon carbide (SiC) consisting of the elements belonging to the 14th group (IVb group) is known as one of the IV-IV group compound semiconductor materials. Since it is possible to obtain a silicon oxide ($SiO_2$) film from silicon carbide, voltage-driven-type devices having a MOS structure constituted of a metal, an oxide film, and a semiconductor are realized. The realization of the voltage-driven-type devices having a MOS structure by employing silicon carbide is very advantageous for the device application technologies.

As compared with silicon, silicon carbide is characterized in the following aspects. The band gap of silicon carbide is wider than that of silicon. The saturation drift velocity of silicon carbide is faster than that of silicon. The dielectric breakdown voltage of silicon carbide is higher than that of silicon. The thermal conductivity of silicon carbide is higher than that of silicon. Therefore, the device that employs silicon carbide (hereinafter referred to as the "silicon carbide device") is more advantageous than the device that employs silicon (hereinafter referred to as the "silicon device"), since the silicon carbide device facilitates reducing the electric power consumption, since the silicon carbide device can be used in a higher-temperature environment, and since the silicon carbide device facilitates operating faster.

Therefore, the silicon carbide device facilitates improving the performances thereof more effectively than the silicon device. Therefore, silicon carbide is expected to be a semiconductor material of the next generation beyond the limit of silicon. As the silicon carbide devices, Schottky barrier diodes, MOSFETs and such devices have been developed and put into market.

In the voltage-driven-type devices having a MOS structure and employing silicon carbide, a silicon oxide film, that will work as a gate insulator film, for example, is formed on a substrate made of silicon carbide (hereinafter referred to as a "silicon carbide substrate" or sometimes as a "SiC substrate"). Therefore, it is necessary to improve the reliability of the silicon oxide film and the interface properties at the interface between the silicon oxide film and the silicon carbide substrate to be high enough to make the voltage-driven-type devices having a MOS structure to be used practically.

A method of forming a silicon oxide film on a 4H—SiC substrate by dry oxidation has been proposed (see, for example, N. S. Saks, S. S. Mani, and A. K. Agarwal, "Interface trap profile near the band edges at the 4H—SiC/$SiO_2$ interface", APPLIED PHYSICS LETTERS, 17 Apr. 2000, VOL. 76, NUMBER 16, pp. 2250-2252).

Another method that preliminarily treats the surface of a silicon carbide substrate using an ammonia ($NH_3$) gas and deposits a silicon oxynitride (SiON) film by the chemical vapor deposition (CVD) method on the silicon carbide substrate treated preliminarily has been proposed (see, for example, Y. Iwasaki, H. Yano, T. Hatayama, Y. Uraoka, and T. Fuyuki, "$NH_3$ Plasma Pretreatment of 4H—SiC(000-1) Surface for Reduction of Interface States in Metal-Oxide-Semi conductor Devices", Applied Physics Express 3, Japan Society of Applied Physics, 2010, 026201, pp. 1-3).

Still another method is described by M. Noborio, J. Suda, and T. Kimoto, "4H—SiC MIS Capacitors and MISFETs With Deposited SiNx/$SiO_2$ Stack-Gate Structures". IEEE TRANSACTIONS ON ELECTRON DEVICES, VOL. 55, NO. 8. AUGUST 2008, pp. 2054-2060. First, a silicon nitride ($Si_3N_4$) film is grown by the CVD method on a silicon carbide substrate. Then, a silicon oxide film is deposited on the silicon nitride film. Then, annealing is conducted in a nitrogen gas ($N_2$) atmosphere at 1300° C.

A method of manufacturing a semiconductor device that includes a transition layer, 1 nm or less in thickness, at the interface between a SiC substrate and a gate insulator film is proposed in Japanese Patent No. JP 4647211. The method proposed in Japanese Patent No. JP 4647211 includes the step of oxidizing a part of the SiC substrate for forming a first insulator film; the step of forming a second insulator film above the first insulator film; the step of forming a gate electrode above a part of the SiC substrate with the first and second insulator films sandwiched between the SiC substrate and the gate electrode, and the step of forming a source region and a drain region in a part of the SiC substrate.

The method further includes, in subsequent to the step for forming the first insulator film, the step of annealing the wafer in a nitrogen monoxide atmosphere under the pressure of $1.4 \times 10$ Pa or higher and the atmospheric pressure or lower, at a temperature between 600° C. and 1400° C., and for 1 hr or longer and 3 hr or shorter. In the step of forming the second insulator film, the second insulator film is formed by the CVD method at a temperature between 600° C. and 1000° C. but lower than the above-described annealing temperature in an atmosphere containing silane and dinitrogen monoxide. After the step of forming the second insulator film, the annealing is conducted at a temperature between 600° C. and 1000° C. but lower than the temperature, at which the second insulator film is formed, in an atmosphere containing nitrogen monoxide.

Although various methods have been proposed for forming a silicon oxide film on a silicon carbide substrate, any method that fully brings out the intrinsic properties of silicon carbide has not been established yet. For example, the conventional methods described above can not obtain, at the interface between a silicon oxide film and a silicon carbide substrate, any interface property excellent enough to make voltage-driven-type devices having a MOS structure to be used practically.

The interface properties at the interface between a silicon oxide film and a silicon carbide substrate affect adversely the channel mobility and the threshold voltage Vth of the voltage-driven-type devices having a MOS structure. For obtaining interface properties excellent enough to make voltage-driven-type devices having a MOS structure to be used practically, it is necessary to reduce the interface state density at the interface between a silicon carbide substrate and a silicon oxide film and the flat band voltage Vfb of the silicon carbide substrate close to zero.

In detail, for obtaining interface properties excellent enough to make voltage-driven-type devices having a MOS structure to be used practically, it is necessary to reduce the interface state density at the interface between a silicon carbide substrate and a silicon oxide film down to the order of $1 \times 10^{11}$ $cm^{-2} \cdot eV^{-1}$ and to bring the flat band voltage Vfb of the silicon carbide substrate close to zero. The flat band voltage Vfb is the potential variation of the silicon carbide substrate changing from the flat band state caused by bonding the silicon carbide substrate and the silicon oxide film to each other.

By the technique reported by N. S. Saks, et al 17 Apr. 2000, the channel mobility becomes low, since the interface state density is high, around $1\times10^{13}$ $cm^{-2}\cdot eV^{-1}$, at the interface between a silicon carbide substrate and a silicon oxide film near the conduction band of the silicon carbide substrate as shown in FIG. 3 of N. S. Saks, et al 17 Apr. 2000. By the technique reported by Y. Iwasaki, et al 2010, the threshold voltage Vth becomes high, since the flat band voltage Vfb of the silicon carbide substrate is around 6.4 V as listed in Table 1 of Y. Iwasaki, et al 2010.

The technique reported by M. Noborio, et al AUGUST 2008 makes the interface state density at the interface between the silicon carbide substrate and the silicon oxide film and the flat band voltage Vfb of the silicon carbide substrate meet the conditions described above for obtaining interface properties excellent enough to make the voltage-driven-device to be used practically. However, it is necessary for the technique to oxidize the silicon nitride film deposited on the silicon carbide substrate by the CVD method.

As described in FIG. 1 of M. Noborio, et al AUGUST 2008, it is necessary to conduct an anneal treatment in a dinitrogen monoxide ($N_2O$) gas atmosphere at 1300° C. for oxidizing the silicon nitride film in addition to the anneal treatment in a nitrogen ($N_2$) gas atmosphere at 1300° C. Therefore, it is necessary for the technique to conduct anneal treatments twice at a high temperature. It is also necessary for the technique described by N. S. Saks, et al 17 Apr. 2000 to conduct anneal treatments twice at a high temperature.

In view of the foregoing, it would be desirable to obviate the problems described above. It would be also desirable to provide a method of manufacturing a semiconductor device that exhibits excellent interface properties including an interface state density and a flat band voltage.

SUMMARY OF THE INVENTION

According to the invention, there is provided a method of manufacturing a semiconductor device, the method including the steps of (a) irradiating a plasma for growing a silicon nitride film on a silicon carbide substrate; and (b) forming a silicon oxide film on the silicon nitride film.

The other objects, features, and advantages of the present invention are specifically set forth in or will become apparent from the following detailed description of the invention when read in conjunction with the accompanying drawings.

BRIEF DESCRIPTIONS OF THE DRAWINGS

Figure 3:
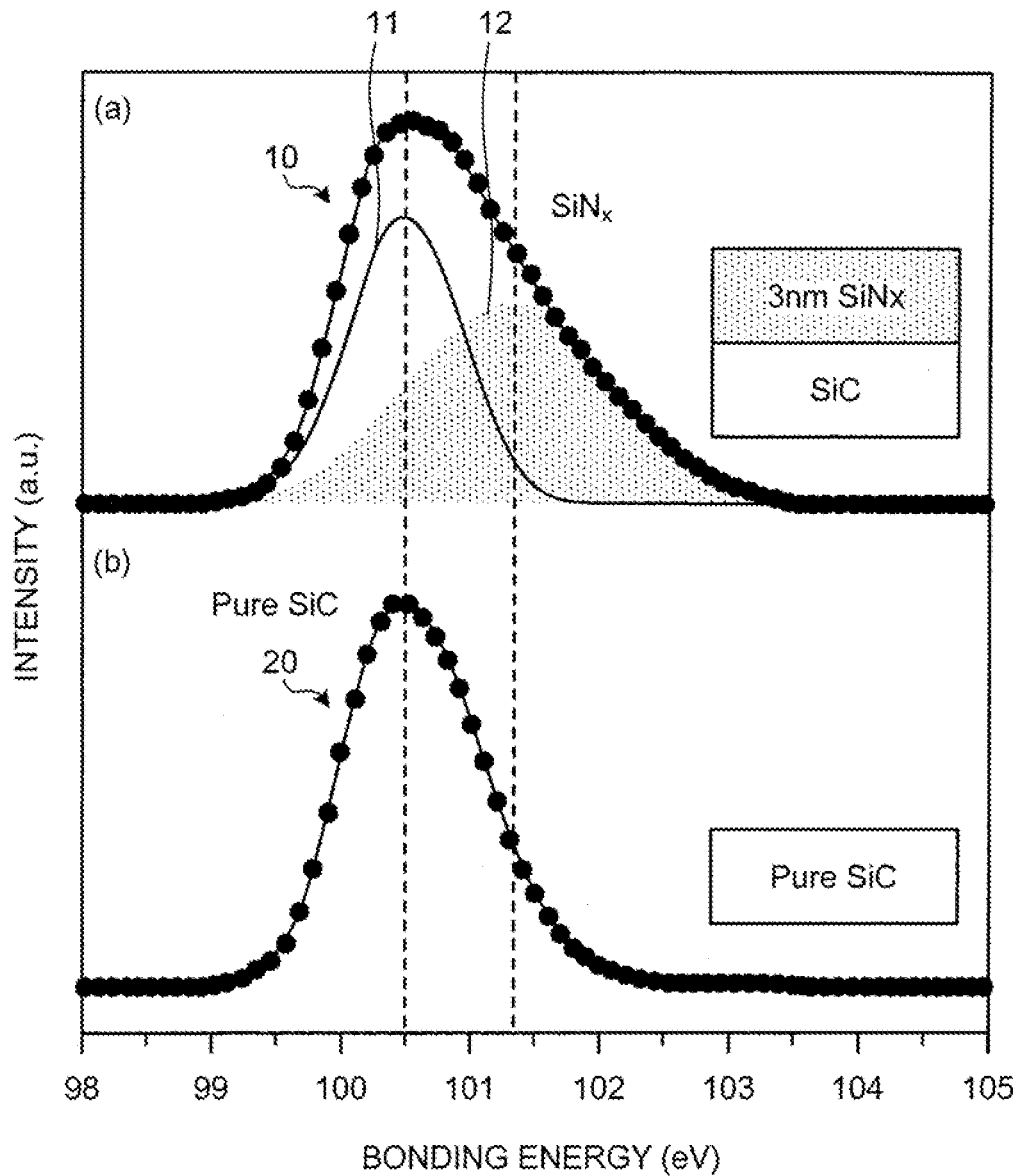

FIG. 3 describes the results of the X-ray photoelectron spectroscopic analysis (XPS) method of a first specimen according to the invention and a comparative specimen.

Figure 4:
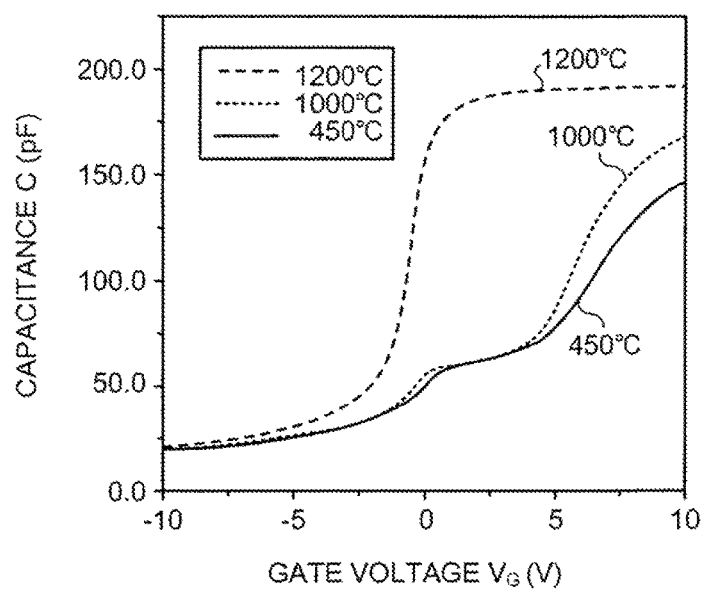

FIG. 4 relates the electrostatic capacitance with the gate voltage for a second specimen with the nitrogen anneal temperature as a parameter.

Figure 5:
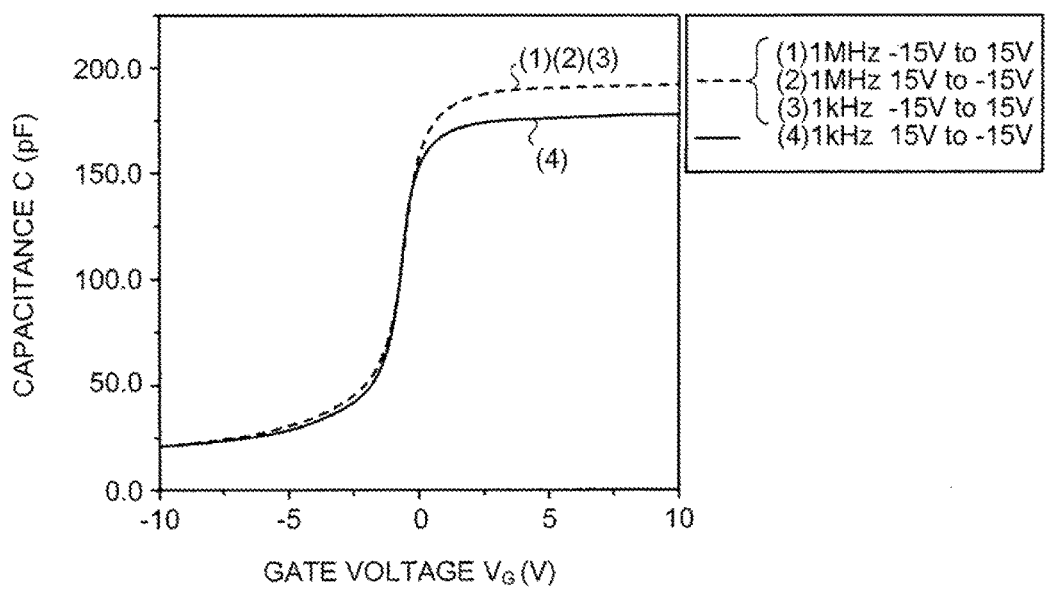

FIG. 5 relates the electrostatic capacitance with the gate voltage for the second specimen with the operating frequency and the full amplitude of the gate voltage as parameters.

Figure 6:
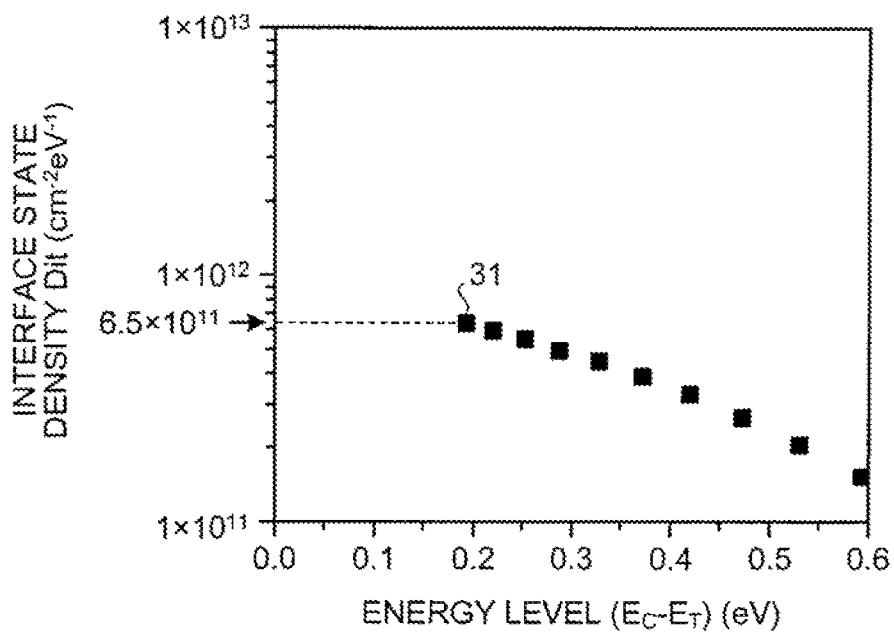

FIG. 6 relates the interface state density Dit with the energy level ($E_C-E_T$) from the conduction band edge of the second specimen, the anneal time thereof is 1 hr.

Figure 7:
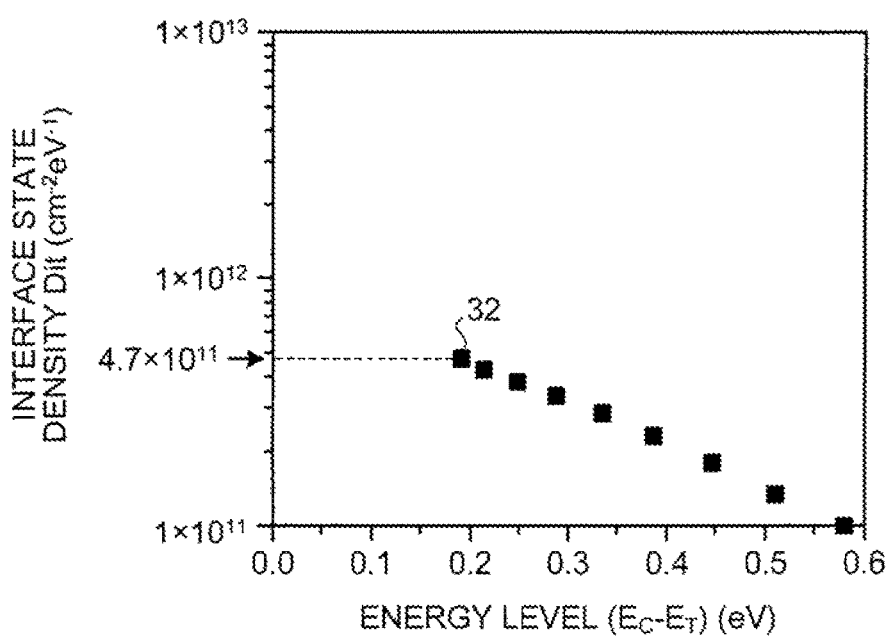

FIG. 7 relates the interface state density Dit with the energy level ($E_C-E_T$) from the conduction band edge of the second specimen, the anneal time thereof is 2 hr.

Figure 8:
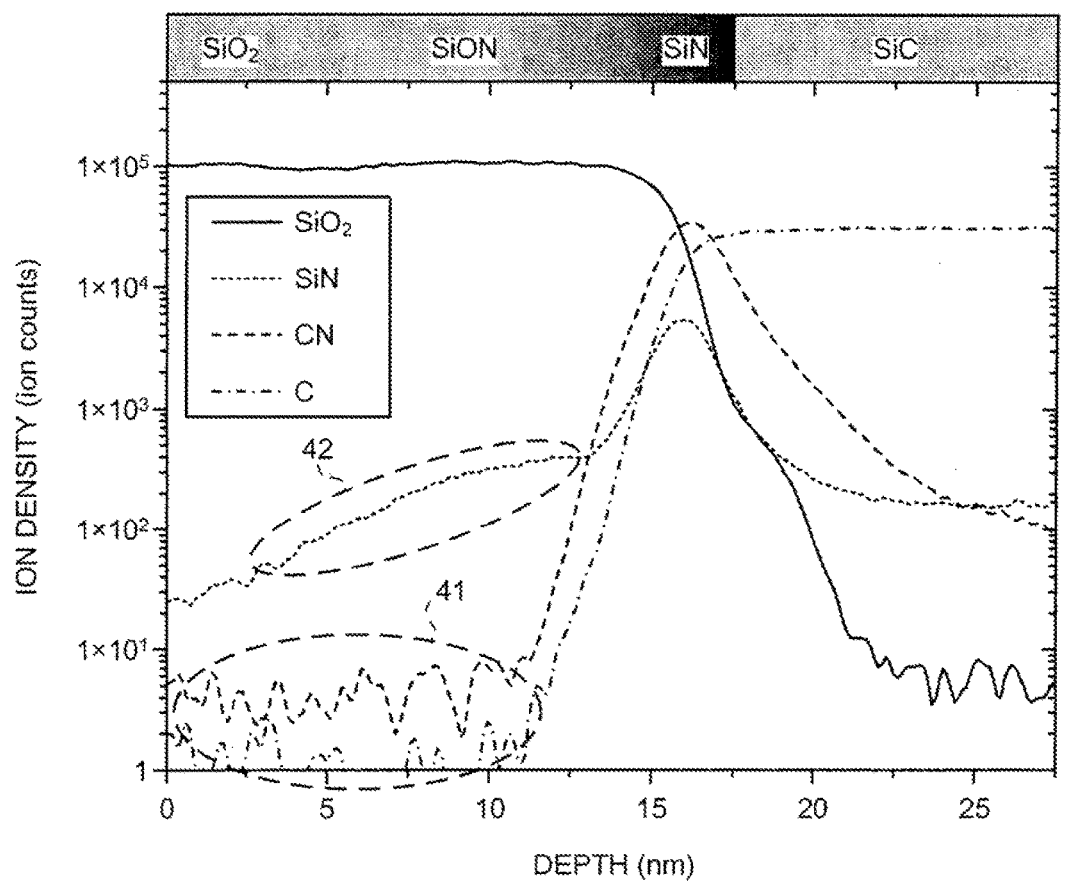

FIG. 8 describes the results of the mass analysis of the third specimens obtained by the secondary ion-microprobe mass spectrometer (SIMS) method.

Figure 9:
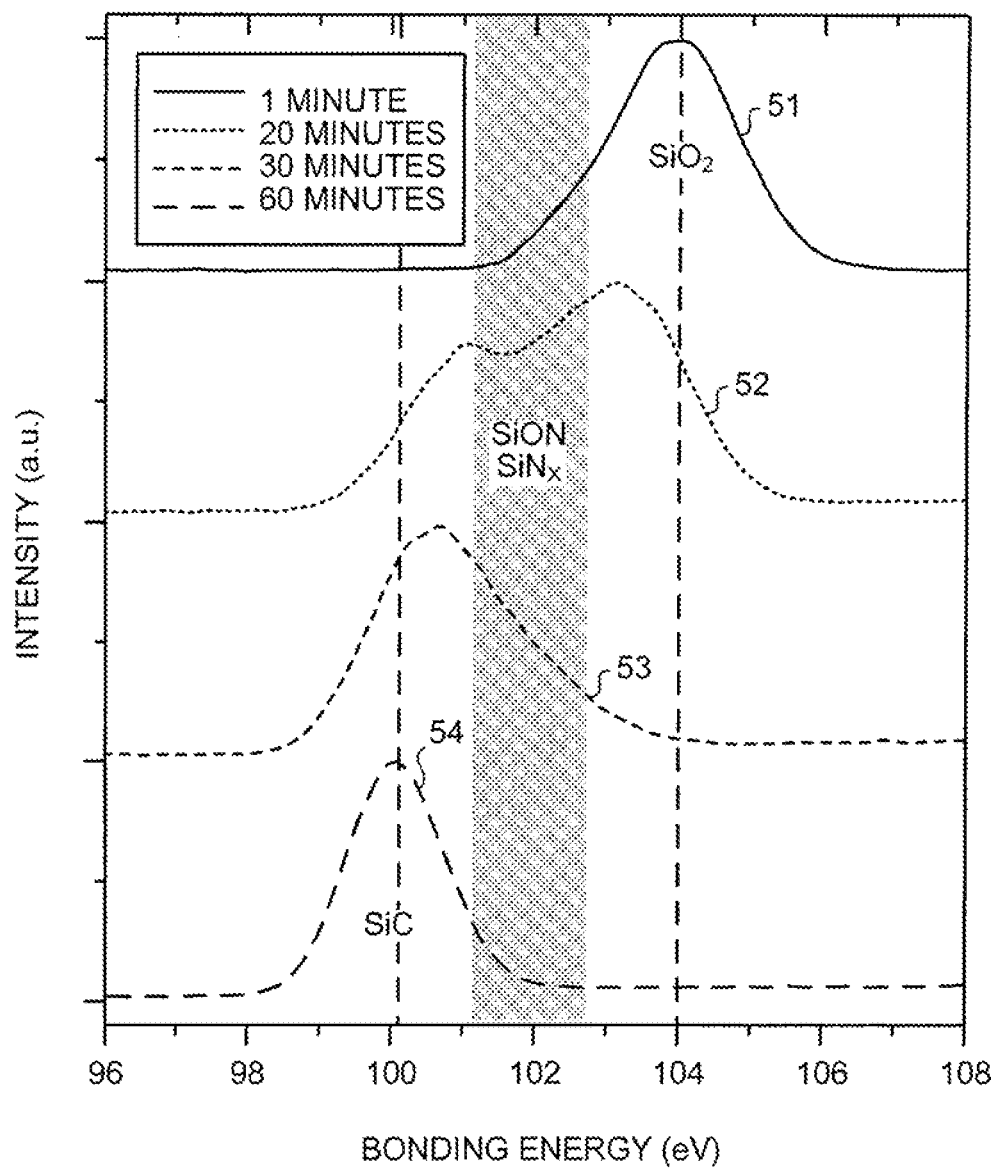

FIG. 9 describes the XPS results of the third specimen.

Figure 10:
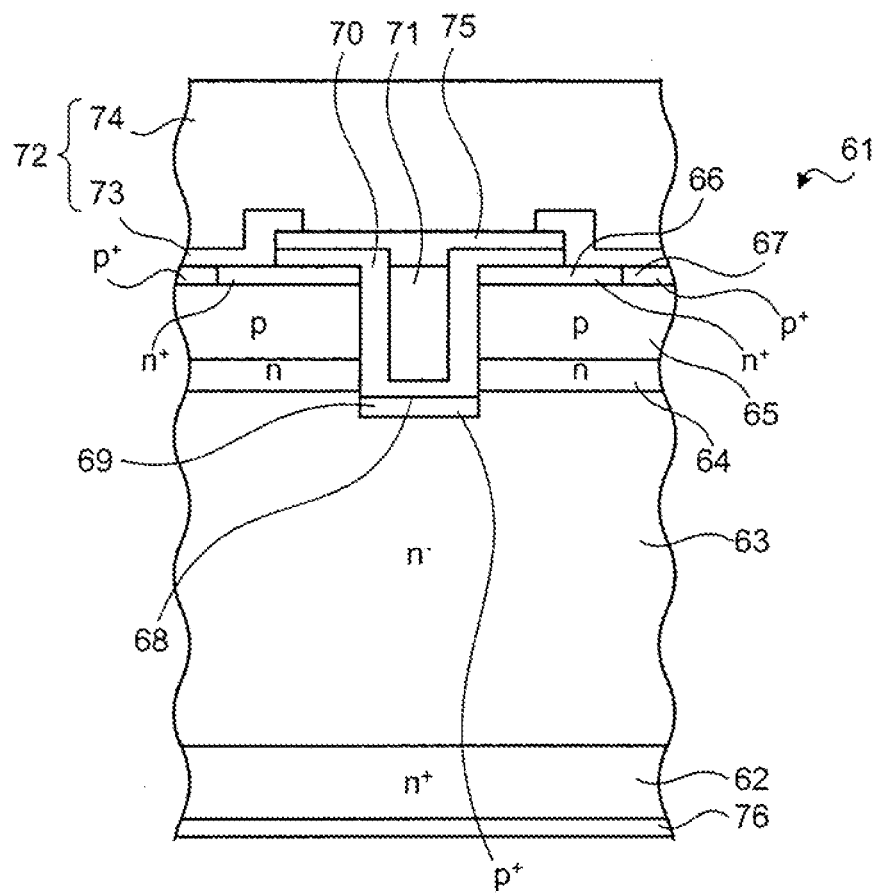

FIG. 10 is the cross sectional view of a semiconductor device according to the invention.

MODES FOR CARRYING OUT THE INVENTION

Now the invention will be described in detail hereinafter with reference to the accompanied drawings which illustrate the preferred embodiments of the invention. In the following descriptions, the n-type layer or the n-type region is a layer or a region, therein electrons are majority carriers. The p-type layer or the p-type region is a layer or a region, therein holes are majority carriers. The suffix "+" on the shoulder of the letter "n" or "p" indicating the conductivity type of the layer or the region indicates that the layer or the region is doped relatively heavily. The suffix "−" on the shoulder of the letter "n" or "p" indicating the conductivity type of the layer or the region indicates that the layer or the region is doped relatively lightly. In the following descriptions and drawings, the same reference numerals are used to designate the same or similar constituent elements and their duplicated descriptions will not be made for the sake of simplicity.

Figure 1:
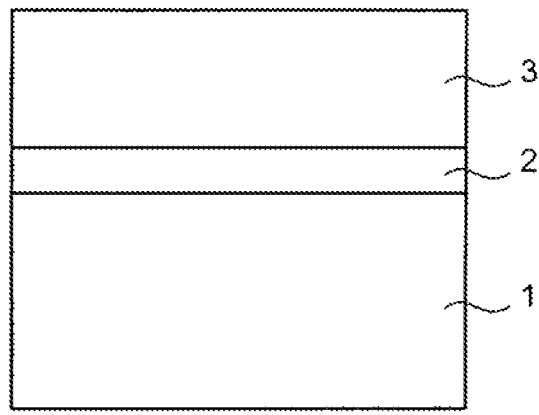
FIG. 1 is the cross sectional view showing the fundamental structure of a semiconductor device according to the invention.

FIG. 1 is the cross sectional view showing the fundamental structure of a semiconductor device according to the invention. The semiconductor device shown in FIG. 1 includes semiconductor substrate made of silicon carbide (hereinafter referred to as "silicon carbide substrate" or sometimes as a "SiC substrate") 1, a silicon nitride (SiN) film 2 on silicon carbide substrate 1, and a silicon oxide ($SiO_2$) film 3 on silicon nitride film 2. The semiconductor device shown in FIG. 1 is a voltage-driven-type device having a MOS structure constituted of a metal, an oxide film, and a semiconductor.

Silicon carbide substrate 1 may be a 4H—SiC substrate with no problem. The silicon (Si) atoms and the carbon (C) atoms in the silicon carbide substrate 1 surface are terminated by nitrogen (N) atoms. Due to the termination, compounds such as silicon nitride (including silicon nitride film 2) and carbon nitride (CN) are yielded in the silicon carbide substrate 1 surface. Silicon carbide substrate 1 constitutes a drift region in a MOS gate structure.

On the silicon carbide substrate 1 surface, a silicon carbide region, the conductivity type of which is the same with the conductivity type of silicon carbide substrate 1, may be formed. When the silicon carbide region is on the silicon carbide substrate 1 surface, the silicon atoms and the carbon atoms in the silicon carbide region surface are terminated by nitrogen atoms and compounds such as silicon nitride (including silicon nitride film 2) and carbon nitride are yielded in the silicon carbide region surface. The silicon carbide region is formed of an epitaxial layer, for example. Now the case, in which silicon nitride film 2 is formed on the silicon carbide substrate 1 surface, will be exemplary described below.

Silicon nitride film 2 is a film grown by irradiating a nitrogen plasma to the silicon carbide substrate 1 surface.

For example, silicon nitride film 2 is a film grown on the silicon carbide substrate 1 surface by irradiating an electron cyclotron resonance (ECR) plasma. Silicon nitride film 2 functions as a passivation film that prevents carbon atoms having an unbonded hand from causing at the interface between silicon carbide substrate 1 and silicon oxide film 3.

Silicon oxide film 3 is deposited on silicon nitride film 2. Silicon oxide film 3 may be a deposition film deposited on silicon nitride film 2 by the plasma chemical vapor deposition (PCVD) method with no problem. Silicon oxide film 3 may be a deposition film deposited on silicon nitride film 2 by the ECR plasma CVD method with no problem.

In the surface portion of silicon oxide film 2 on the silicon nitride film 3 side, silicon oxynitride (SiON) is formed by the nitrogen atoms which have diffused from the silicon nitride film 2 side. On silicon carbide substrate 1 with silicon nitride film 2 and silicon oxide film 3 are formed, a MOS gate structure (not shown) is formed. Silicon oxide film 3 constitutes the gate insulator film in the MOS gate structure.

Figure 2:
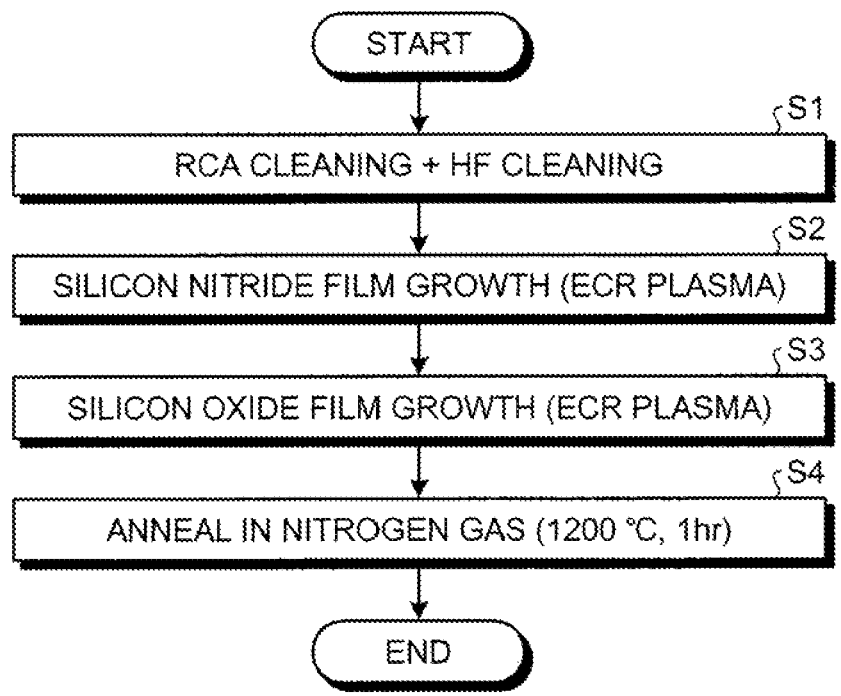
FIG. 2 is a flow chart describing the method of manufacturing the semiconductor device according to the invention.

Now the method of forming silicon oxide film 3 on SiC substrate 1 will be described below. FIG. 2 is a flow chart describing the method of manufacturing the semiconductor device according to the invention. First, 4H—SiC substrate 1 is prepared. Then, the silicon carbide substrate 1 surface is cleaned by the so-called RCA cleaning using a mixed solution containing hydrogen peroxide ($H_2O_2$) as a cleaning solvent and by the cleaning using a dilute hydrofluoric acid (HF) as a cleaning solvent (hereinafter referred to as the "HF cleaning") (Step S1).

In detail, the HF cleaning is conducted to clean the silicon carbide substrate 1 surface in the step S1. Then, the silicon carbide substrate 1 surface is cleaned using a mixed solution containing ammonia ($NH_4OH$) and hydrogen peroxide (hereinafter referred to as an "SC-1 solution") as a cleaning solvent. Then, the silicon carbide substrate 1 surface is cleaned again by the HF cleaning. Then, the silicon carbide substrate 1 surface is cleaned using a mixed solution containing hydrochloric acid (HCl) and hydrogen peroxide ($H_2O_2$) (hereinafter referred to as an "SC-2 solution") as a cleaning solvent. A series of cleaning from the cleaning with the SC-1 solution to the cleaning with the SC-2 solution is the step of RCA cleaning.

Before conducting the treatment of the step S1, a silicon carbide region, the conductivity type thereof is the same with the conductivity type of silicon carbide substrate 1, may be formed on silicon carbide substrate 1 by the epitaxial growth method. When the silicon carbide region is on silicon carbide substrate 1, the treatment of the step S1 is applied to the silicon carbide region surface. Even when a silicon carbide region is on the silicon carbide substrate surface, the treatments described later are conducted in the same manner as in the case, in which only silicon carbide substrate 1 is used.

Then, silicon nitride film 2 is grown on silicon carbide substrate 1 by irradiating a plasma (Step S2). In detail, by bringing a material gas into a plasma state, and by irradiating the atoms contained in the material gas to silicon carbide substrate 1, silicon nitride film 2 is grown on the silicon carbide substrate 1 surface.

By the plasma irradiation, the covalent bondings between the silicon atoms and carbon atoms in the silicon carbide substrate 1 surface are destroyed and silicon and carbon atoms having unbonded hands are generated. As soon as the silicon and carbon atoms having unbonded hands are generated in the silicon carbide 1 surface, the unbonded hands are terminated by nitrogen atoms. By the termination, compounds such as silicon nitride (including silicon nitride film 2) and carbon nitride are yielded in the silicon carbide substrate 1 surface.

It is preferable to conduct the treatment described above by irradiating an ECR plasma in the step S2. By bringing the material gas into an ECR plasma state, by generating nitrogen atoms having unpaired electrons which have absorbed the electric field energy, and by irradiating the nitrogen atoms having unpaired electrons to the silicon carbide substrate 1 surface, silicon nitride film 2 is grown on silicon carbide substrate 1. In detail, an ECR plasma generator may be used, for example. The setting conditions of the ECR plasma generator, under which silicon nitride film 2 is grown in the step S2, will be described below exemplary.

The inside of the chamber of the ECR plasma generator is set under the atmospheric pressure and at the room temperature and a mixed gas containing argon (Ar) at the flow rate of 10 sccm and nitrogen ($N_2$) at the flow rate of 15 sccm is introduced into the chamber as a material gas. For bringing the material gas into a plasma state using the ECR plasma in the ECR plasma generator, a microwave power of 250 W is fed as an electric power for generating an electric field energy absorbed by the electrons for making the electrons conduct cyclotron movements. The treatment time, for which silicon nitride film 2 is grown, may be 30 min with no problem.

Then, silicon oxide film 3 is grown on the silicon nitride film 2 surface (Step S3). In detail, silicon oxide film 3 may be deposited on silicon nitride film 2 by the plasma CVD method or by the ECR plasma CVD method. When silicon oxide film 3 is deposited on silicon nitride film 2 by the ECR plasma CVD method, an ECR plasma generator may be used with no problem. The setting conditions of the ECR plasma generator, under which silicon oxide film 3 is grown in the step S3, will be exemplary described below.

The inside of the chamber of the ECR plasma generator is set under the atmospheric pressure and at the room temperature and a mixed gas containing argon (Ar) at the flow rate of 16 sccm and oxygen ($O_2$) at the flow rate of 8 sccm is introduced into the chamber as a material gas. A microwave power of 300 W and a radio frequency (RF) power of 300 W are fed to the ECR plasma generator as electric powers for bringing the material gas into a plasma state using the ECR phenomena. The treatment time, for which silicon oxide film 3 is formed, may be 30 min with no problem.

Then, silicon carbide substrate 1 with silicon nitride film 2 and silicon oxide film 3 formed thereon is annealed in a nitrogen atmosphere (Step S4). It is preferable to conduct the anneal treatment at 1200° C. or higher and for 1 hr or longer. By the anneal treatment of the step S4, nitrogen atoms diffuse to the silicon oxide film 3 side from silicon nitride film 2 across the interface between silicon oxide film 3 and silicon nitride film 2. By the diffusion, silicon oxynitride is formed on the silicon oxide film 3 side of the interface between silicon oxide film 3 and silicon nitride film 2.

Then, a MOS gate structure is formed by the general method on silicon carbide substrate 1 with silicon nitride film 2 and silicon oxide film 3 formed thereon. By the formation of the MOS gate structure, a voltage-driven-type device having a MOS (metal-oxide-semiconductor) structure including silicon carbide substrate 1, silicon nitride film 2, and silicon oxide film 3 is completed.

The surface of a first specimen formed by the treatments of the steps S1 and S2 is analyzed by X-ray photoelectron spectroscopy (XPS). FIG. 3 describes the results of the XPS analysis. On the right side of the area (a) in FIG. 3, the cross sectional structure of the first specimen is shown schematically. On the right side of the area (b) in FIG. 3, the cross sectional structure of a comparative specimen is shown schematically.

First, silicon nitride film 2 is formed on the 4H—SiC substrate 1 surface by the treatments of the steps S1 and S2. The thickness of silicon nitride film 2 is set to be 3 nm. Thus, the first specimen is completed. In other words, the first specimen is constituted of SiC substrate 1 and silicon nitride film 2 on silicon carbide substrate 1. Then, the silicon nitride film 2 side surface of the first specimen is analyzed by the XPS method.

As a comparative specimen, a 4H—SiC substrate is prepared. The comparative specimen has a structure including an n-type silicon carbide substrate and an n-type epitaxial layer grown of the silicon carbide substrate. In other words, the comparative specimen is a pure silicon carbide substrate containing silicon carbide at the purity of almost 100%. The n-type epitaxial layer side surface of the comparative specimen is analyzed by the XPS method.

The results of the surface analysis by the XPS method for the first and comparative specimens are as follows. As shown in the area (a) of FIG. 3, spectrum is obtained for the first specimen. Spectrum 10 has a peak at 100.5 eV, that is the bonding energy of the Si (2p) inner-shell level. As shown in the area (b) of FIG. 3, spectrum 20 is obtained for the comparative specimen. Spectrum 20 has a peak at 100.5 eV, that is the bonding energy of the Si (2p) inner-shell level.

Spectrum 10 of the first specimen peaks at the position, almost the same with the peak position on spectrum 20 of the comparative specimen. Spectrum 10 of the first specimen has a full width at half maximum (FWHM) wider than that on spectrum 20 of the comparative specimen. Since the comparative specimen is a pure silicon carbide substrate containing silicon carbide at the purity of almost 100%, spectrum 20 is the spectrum of silicon carbide.

Based on the result indicating that the FWHM of spectrum 10 of the first specimen is wider than that of spectrum 20 of the comparative specimen, it is estimated that nitrides are formed in the first specimen surface. Overlapping peaks on spectrum are separated (by peak fitting). As a result, first spectrum component 11 and second spectrum component 12 are obtained as described in the area (a) of FIG. 3.

First spectrum component 11 has a peak position and an FWHM, almost the same with those of specimen 20 of the comparative specimen. Therefore, first spectrum component 11 is the spectrum of silicon carbide. The peak position of second spectrum component 12 is almost the same with the peak position on the spectrum of silicon nitride ($SiN_x$). Therefore, it is confirmed that silicon nitride film 2 is grown on the first specimen surface by the treatments conducted in the steps S1 and S2.

On a second specimen obtained by the treatments of the steps S1 through S4, the relation (C-V characteristics) between the electrostatic capacitance C and the voltage (hereinafter referred to as the "gate voltage") $V_G$ is investigated. The C-V characteristics, obtained by applying the voltage $V_G$ between silicon carbide substrate 1 and silicon oxide film 3 of the second specimen, are investigated.

FIG. 4 relates the electrostatic capacitance with the gate voltage for the second specimen with the anneal temperature in the step S4 as a parameter. FIG. 5 relates the electrostatic capacitance with the gate voltage for the second specimen with the operating frequency and the full amplitude of the gate voltage as parameters.

First, the dependence of the electrostatic capacitance of the second specimen on the anneal temperature in the step S4 is investigated. In detail, n-type 4H—SiC substrate 1 is prepared. Then, an n-type epitaxial layer is grown on silicon carbide substrate 1. Then, silicon nitride film 2 and silicon oxide film 3 are formed on silicon carbide substrate 1 by the treatments of the steps S1 through S3. The thickness of silicon nitride film 2 is set to be 3 nm. The thickness of silicon oxide film 3 is set to be 50 nm. Thus, the second specimen is completed.

In other words, the second specimen has a structure, in which silicon nitride film 2 is formed on silicon carbide substrate 1 and silicon oxide film 3 is formed on silicon nitride film 2. A plurality of the second specimens is fabricated. The anneal treatment of the step S4 is conducted for 1 hr on the second specimens. The anneal temperature is different from a second specimen to a second specimen. Then, the electrostatic capacitance C of each second specimen is measured at the gate voltage $V_G$ applied thereto. In FIG. 4, the results at the annealing temperature of 450° C., 1000° C., and 1200° C. are described.

It is confirmed that the flat band voltage Vfb of the second specimen is 0.16 V at the annealing temperature of 1200° C. as described in FIG. 4. It is confirmed that the flat band voltage Vfb of the second specimen annealed at 450° C. or 1000° C., lower than 1200° C., is impaired as compared with that of the second specimen annealed at 1200° C.

Using the second specimen, the annealing temperature thereof is 1200° C., the operating frequency of the gate voltage $V_G$ applied to the second specimen is changed variously and the dependence of the electrostatic capacitance C of the second specimen on the operating frequency of the gate voltage V is investigated.

The operating frequency of the gate voltage $V_G$ applied to the second specimen is set as follows.

(1) Frequency: 1 MHz, Full amplitude: from −15 V to +15 V (2) Frequency: 1 MHz, Full amplitude: from +15 V to −15 V (3) Frequency: 1 kHz, Full amplitude: from −15 V to +15 V (4) Frequency: 1 kHz, Full amplitude: from +15 V to −15 V The measured electrostatic capacitance C of the second specimens, to which gate voltage $V_G$ is applied at any of the operating frequency sets, is described in FIG. 5.

It is confirmed from FIG. 5 that the electrostatic capacitance C of the second specimen does not depend on the operating frequency of the gate voltage $V_G$. It is confirmed from the results described in FIGS. 4 and 5 that by conducting the anneal treatment of the step S4 at 1200° C. or higher, it is possible to make the flat band voltage Vfb come close almost to zero and to obtain excellent C-V characteristics not affected adversely by the operating frequency of the gate voltage $V_G$.

The interface state density Dit at the interface between silicon carbide substrate 1 and silicon oxide film 3 in the second specimen, the anneal temperature thereof is 1200° C., is measured. FIG. 6 relates the interface state density Dit with the energy level ($E_C$–$E_T$) from the conduction band edge of the second specimen, the anneal time thereof is 1 hr. FIG. 7 relates the interface state density Dit with the energy level ($E_C$–$E_T$) from the conduction band edge of the second specimen, the anneal time thereof is 2 hr.

As described in FIG. 6, the interface state density at the interface between silicon carbide substrate 1 and silicon oxide film 3 in the second specimen, the anneal time thereof is 1 hr, is $6.5 \times 10^{11}$ $cm^{-2} \cdot eV^{-1}$ near conduction band 31. As described in FIG. 7, the interface state density at the interface between silicon carbide substrate 1 and silicon nitride film 2 in the second specimen, the anneal time thereof is 2 hr, is $4.7 \times 10^{11}$ cm$^{-2}$ eV$^{-1}$ near the conduction band 32.

Form the results described in FIGS. 6 and 7, it is confirmed that the interface state density at the interface between silicon carbide substrate 1 and silicon oxide film 3 is reduced to the order of $1 \times 10^{11}$ cm$^{-2}$·eV$^{-1}$ by setting the anneal temperature to be 1200° C. and the anneal time to be 1 hr or longer. It is also confirmed that as the anneal time is longer, the interface state density at the interface between silicon carbide substrate 1 and silicon oxide film 3 is reduced more.

Then, the mass analysis of a third specimen formed by the treatments of the steps S1 though S4 is conducted by the secondary ion-microprobe mass spectrometer (SIMS) method. FIG. 8 describes the results of the mass analysis of the third specimens obtained by the SIMS method.

First, n-type 4H—SiC substrate 1 is prepared. Then, silicon nitride film 2 is formed on silicon carbide substrate 1 and silicon oxide film 3 on silicon nitride film 2 by the treatments of the steps S1 through S4. Thus, a third specimen is completed. The third specimen has a structure that includes silicon carbide substrate 1, silicon nitride film 2 on silicon carbide substrate 1, and silicon oxide film 3 on silicon nitride film 2. Then, the mass analysis of the third specimen is conducted by the SIMS method. The results of the analysis in the vicinity of the interface between silicon carbide substrate 1 and silicon oxide film 3 are described in FIG. 8.

It is confirmed that silicon nitride (SiN) film 2 is formed at the interface between silicon carbide substrate 1 and silicon oxide film 3 and that carbon (C) atom diffusion from silicon carbide substrate 1 to silicon oxide film 3 is suppressed (cf. the area designated by the reference numeral 41 in FIG. 8). It is confirmed that diffusion 42 of nitrogen (N) atoms is caused on the silicon oxide film 3 side and a silicon oxynitride (SiON) film is formed at the interface between silicon nitride film 2 and silicon oxide film 3.

Then, the composition analysis of the third specimen is conducted by the X-ray photoelectron spectroscopy (XPS) from the silicon oxide film 3 surface to the depth of 10 nm in the third specimen. FIG. 9 describes the XPS results of the third specimen. Every time when the silicon oxide film 3 side surface of the third specimen is removed uniformly by etching, the etching surface is analyzed and the bonding energy of the Si(2p) inner-shell level at the spectrum peak position is measured.

In FIG. 9, the results of the surface analysis of the etching planes 1 min later, min later, 30 min later, and 60 min later from the start of etching are described. As described in FIG. 9, spectra 51, 52, 53, and 54 are obtained from the etching planes of the third specimen 1 min later, 20 min later, 30 min later, and 60 later min later, respectively, from the start of etching.

Spectrum 51 peaking at 104 eV, that is the bonding energy of silicon oxide (SiO2), is obtained from the etching plane of the third specimen 1 min later from the start of etching. Spectrum 54 peaking at 100.5 eV, that is the bonding energy of silicon carbide (SiC), is obtained from the etching plane of the third specimen 60 min later from the start of etching.

Spectra 52 and 53 obtained 20 min later and 30 min later, respectively, from the start of etching, peak at the bonding energies lower than the bonding energy of silicon oxide but higher than the bonding energy of silicon carbide. In detail, the peak position of spectrum 52 is almost the same with the peak position of the silicon oxynitride (SiON) spectrum. The peak position of spectrum 53 is almost the same with the peak position of the silicon oxynitride (SiNX) spectrum.

In the same manner as from the results described in FIG. 8, it is confirmed, from the results described in FIG. 9, that silicon nitride film 2 is formed at the interface between silicon carbide (SiC) substrate 1 and silicon oxide film 3 and that silicon oxynitride film is formed at the interface between silicon nitride film 2 and silicon oxide film 3.

In the case of forming a silicon oxide film on a silicon carbide substrate, the silicon atom in the silicon carbide substrate and the oxygen atom in the silicon oxide film combine with each other, causing silicon and carbon atoms, each having an unbonded hand, on the silicon carbide substrate surface. The carbon atom having an unbonded hand, that is the carbon atom not terminated, impairs the interface properties at the interface between the silicon carbide substrate and the silicon oxide film.

In the case of depositing a silicon nitride film on a silicon carbide substrate surface by the CVD method in the same manner as according to the prior art, the silicon nitride film is deposited in the state, in which the covalent bonding between the silicon atom and the nitrogen atom has been formed already. In the case of depositing a silicon oxide film on the silicon nitride film formed as described above, the oxygen atom in the silicon oxide film diffuses to the interface between the silicon carbide substrate and the silicon nitride film.

Since the oxygen atom that has diffused to the interface between the silicon carbide substrate and the silicon nitride film combines with the silicon atom in the silicon carbide substrate, silicon and carbon atoms, each having an unbonded hand, are caused on the silicon carbide substrate surface. The silicon and carbon atoms, each having an unbonded hand, are terminated hardly by a nitrogen atom. Therefore, the interface properties at the interface between the silicon carbide substrate and the silicon oxide film are impaired by the carbon atoms having an unbonded hand and caused at the interface between the silicon carbide substrate and the silicon oxide film.

In the case of depositing a silicon nitride film on a silicon carbide substrate surface by the CVD method in the same manner as according to the prior art, any nitrogen atom having an unpaired electron is not caused in the silicon nitride film. Therefore, for forming a silicon oxynitride film at the interface between the silicon nitride film and the silicon oxide film, it is necessary to anneal the silicon nitride film at a temperature 1300° C. or higher high enough to oxidize the silicon nitride film.

According to the invention, silicon and carbon atoms, each having an unbonded hand, are caused on the silicon carbide substrate 1 surface and the unbonded hands are terminated by nitrogen atoms having an unbonded hand. As a result, compounds such as silicon nitride (including silicon nitride film 2) and carbon nitride are yielded at the interface between silicon carbide substrate 1 and silicon oxide film 3. Therefore, it is possible to prevent a carbon atom having an unbonded hand from causing at the interface between silicon carbide substrate 1 and silicon oxide film 3.

The nitrogen atom in silicon nitride film 2 formed as described above diffuses toward the silicon oxide film 3 side in the anneal treatment conducted for silicon oxide film 3. Thus, a silicon oxynitride film is formed at the interface between silicon nitride film 2 and silicon oxide film 3. Therefore, it is not necessary to conduct the anneal treatment at 1300° C. or higher for oxidizing silicon nitride film 2.

Since the nitrogen atom in silicon nitride film 2 that has diffused toward the silicon oxide film 3 side forms a silicon oxynitride film, it is possible to prevent the oxygen atom in silicon oxide film 3 from diffusing to the interface between silicon carbide substrate 1 and silicon nitride film 2. Therefore, it is possible to prevent a carbon atom having an unbonded hand from causing at the interface between silicon carbide substrate 1 and silicon oxide film 3.

As described above, silicon nitride film 2 is grown on silicon carbide substrate 1 by generating an ECR plasma and silicon oxide film 3 is formed on silicon nitride film 2 according to the invention. Due to the film formation scheme described above, it is possible to reduce the interface state density at the interface between silicon carbide substrate 1 and silicon oxide film 3 to the order of $1 \times 10^{11}$ cm$^{-2}$·eV$^{-1}$ and to bring the flat band voltage Vfb of silicon carbide substrate 1 close to zero. Therefore, interface properties excellent enough to make voltage-driven-type devices having a MOS structure to be used practically are obtained at the interface between silicon carbide substrate 1 and silicon oxide film 3.

According to the invention, the nitrogen atom in silicon nitride film 2 diffuse to the silicon oxide film 3 side by the anneal treatment conducted on silicon oxide film 3. Therefore, it is possible to form a silicon oxynitride film at the interface between silicon nitride film 2 and silicon oxide film 3 without conducting the anneal treatment at 1300° C. or higher for oxidizing silicon nitride film 2.

Working Examples

An example of the structure of the voltage-driven-type device having a MOS structure and manufactured by the method according to the invention will be described below. FIG. 10 is the cross sectional view of a semiconductor device according to the invention. In the following, the semiconductor device according to the invention will be described in connection with a trench-gate MOSFET exhibiting a breakdown voltage of the 1200 V class, although not necessarily limited thereto. Active section 61 and a breakdown withstanding section (not shown) are formed on a semiconductor substrate. The breakdown withstanding section surrounds active section 61. The semiconductor device according to the invention employs silicon carbide (SiC).

As shown in FIG. 10, n$^-$ SiC layer 63 is formed on n$^+$ SiC layer 62 in active section 61. The n$^+$ SiC layer 62 contains nitrogen (N) as an impurity at a concentration of around $2 \times 10^{18}$ cm$^{-3}$. The n$^-$ SiC layer 63 contains nitrogen (N) as an impurity at a concentration of around $1.0 \times 10^{16}$ cm$^{-3}$. The thickness of n$^-$ SiC layer 63 is around 10 μm, for example.

An n-type SiC layer 64 is formed on n$^-$ SiC layer 63. The n-type SiC layer 64 contains nitrogen (N) as an impurity at a concentration of around $2.0 \times 10^{17}$ cm$^{-3}$. The thickness of n-type SiC layer 64 is around 0.5 μm, for example. A p-type SiC layer 65 is formed on n-type SiC layer 64. The p-type SiC layer 65 contains aluminum as an impurity at a concentration of around $2.1 \times 10^{17}$ cm$^{-3}$. The thickness of SiC layer 65 is around 2.5 μm, for example.

On p-type SiC layer 65, n$^+$ source region 66 and p$^+$ contact region 67 are formed selectively. The n$^+$ source region 66 contains phosphorus (P) as an impurity. The p$^+$ contact region 67 contains aluminum as an impurity. Trench 68, extending to n$^-$ SiC layer 63, is formed through n$^+$ source region 66, p-type SiC layer 65, and n-type SiC layer 64. Trenches 68 are formed at intervals of 5 μm. Trench 68 is 1.2 μm in width and 3 μm in depth.

Along the trench 68 bottom, p$^+$ SiC region 69 is formed directly under trench 68. The p$^+$ SiC region 69 contains aluminum as an impurity at a concentration of around $2 \times 10^{19}$ cm$^{-3}$. Since a depletion layer expands stably due to the formation of p$^+$ SiC region 69, when a high voltage is applied between the source and drain, it is possible to prevent, for example, the breakdown of the oxide film (a part of the gate oxide film) in the trench 68 bottom caused by electric field localization to the trench 68 bottom from occurring. In other words, the breakdown voltage of the device is improved.

Inside trench 68, gate oxide film 70 is formed as a gate insulator film along the side wall and bottom of trench 68. Gate oxide film 70 is 100 nm in thickness, for example. In trench 68, gate electrode 71 working as a control electrode is surrounded by gate oxide film 70. Source electrode 72 is in contact with n$^+$ source region 66 and p$^+$ contact region 67. Source electrode 72 has a double-layered structure consisting of nickel (Ni) film 73 and aluminum film 74.

Nickel film 73 is in contact with n$^+$ source region 66 for securing excellent contact performances between source electrode 72 and n$^+$ source region 66. Interlayer insulator film 75 is formed between gate electrode 71 and source electrode 72. Drain electrode 76 is in contact with n$^+$ SiC layer 62. Drain electrode 76 is made of nickel to secure excellent contact performances with n$^+$ SiC layer 62.

The constituent elements of the semiconductor device shown in FIG. 10 are constituted of silicon carbide substrate 1, silicon nitride film 2, and silicon oxide film 3 in the following manner according to the invention. The n$^+$ SiC layer 62 is constituted of silicon carbide substrate 1, for example. Alternatively, n$^+$ SiC layer 62 and n$^-$ SiC layer 63 may be constituted of silicon carbide substrate 1 with no problem. Still alternatively, n$^+$ SiC layer 62 may be constituted of silicon carbide substrate 1 and n$^-$ SiC layer 63 may be constituted of the silicon carbide region formed on silicon carbide substrate 1 with no problem. Gate insulator film 70 is constituted of silicon oxide film 3, for example.

The invention has been described so far in connection with the working example of a trench-gate MOSFET. However, as far as the device is a voltage-driven-type one having a MOS structure, the invention is applicable to planar MOSFETs, IGBTs and such semiconductor devices having various structures including a silicon oxide film formed on a silicon carbide substrate or a silicon oxide film formed on a silicon carbide region formed on a silicon carbide substrate. The silicon oxide film may be formed not always by the methods described above but by various modified methods as far as the silicon oxide film can be formed on the silicon nitride film. The conductivity type of a semiconductor layer or a semiconductor region (n-type, p-type) may be interchanged with no problem.

As described above, the manufacturing method according the invention is useful to manufacture a semiconductor device including a silicon oxide film formed on a silicon carbide substrate or a silicon oxide film formed on a silicon carbide region formed on a silicon carbide substrate. In detail, the manufacturing method according the invention is useful to manufacture a voltage-driven-type semiconductor device having a MOS (metal-oxide-semiconductor) structure.

According to the invention, the interface state density at the interface between the silicon carbide substrate and the silicon oxide film is reduced to the order of $1 \times 10^{11}$ cm$^{-2}$·eV$^{-1}$ and the flat band voltage Vfb of the silicon carbide substrate is brought close to zero.

By the method of manufacturing a semiconductor device according to the invention, a semiconductor device that exhibits excellent interface properties including an interface state density and a flat band voltage is obtained.

What is claimed is:

1. A method of manufacturing a semiconductor device having a Metal-Oxide-Semiconductor structure comprising a silicon oxide film and a semiconductor made of silicon carbide, the method comprising the steps of:
   (a) irradiating a plasma for growing a silicon nitride film on the semiconductor made of the silicon carbide so that the silicon nitride film directly contacts the semiconductor made of the silicon carbide, the silicon carbide being the semiconductor of the Metal-Oxide-Semiconductor structure; and
   (b) forming the silicon oxide film as an oxide of the Metal-Oxide-Semiconductor structure on the silicon nitride film; wherein an electron cyclotron resonance plasma is irradiated in the step (a) to yield compounds of silicon nitride and carbon nitride in a surface of a silicon carbide substrate;
   (c) annealing the silicon carbide substrate in an atmosphere of $N_2$, the step (c) being conducted in subsequent to the step (b) and the annealing is conducted at 1200° C. or higher;
   wherein the annealing reduces the interface state density between the silicon carbide substrate and the silicon oxide film to an order of $1 \times 10^{11}$ $cm^{-2}$ $eV^{-1}$.

2. The method according to claim 1, wherein the step (a) comprises
   bringing a material gas for forming the silicon nitride film into a plasma state; and
   irradiating atoms contained in the material gas to the silicon carbide substrate for growing the silicon nitride film on the silicon carbide substrate.

3. The method according to claim 2, wherein the material gas comprises a nitrogen gas.

4. The method according to claim 1 wherein the silicon oxide film is deposited on the silicon nitride film in the step (b).

5. The method according to claim 4, wherein the silicon oxide film is deposited on the silicon nitride film by a plasma chemical vapor deposition method in the step (b).

6. The method according to claim 5, wherein the silicon oxide film is deposited on the silicon nitride film by an electron cyclotron resonance plasma chemical vapor deposition method in the step (b).

7. The method according to claim 1, wherein the annealing is conducted for 1 hr or longer.

8. The method according to claim 1, the method further comprising the step of:
   (d) forming a silicon carbide region on the silicon carbide substrate, a conductivity type of the silicon carbide region being the same with a conductivity type of the silicon carbide substrate, the step (d) being conducted prior to the step (a), and
   the step (a) comprising irradiating the plasma for growing the silicon nitride film on the silicon carbide region.

9. The method according to claim 1, the method further comprising the step of:
   prior to step (a), an inside of a chamber of an ECR plasma generator for performing the irradiating of step (a) is set under atmospheric pressure and at room temperature and a mixed gas containing argon (Ar) at a flow rate of 10 sccm and nitrogen ($N_2$) at a flow rate of 15 sccm is introduced into the chamber as a material gas.

* * * * *